(12) United States Patent
Hara et al.

(10) Patent No.: US 11,073,956 B2
(45) Date of Patent: Jul. 27, 2021

(54) CONDUCTIVE MEMBER, TOUCH PANEL, AND DISPLAY DEVICE

(71) Applicant: FUJIFILM Corporation, Tokyo (JP)

(72) Inventors: Daisuke Hara, Kanagawa (JP); Kimito Katsuyama, Kanagawa (JP); Masaya Nakayama, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 16/854,018

(22) Filed: Apr. 21, 2020

(65) Prior Publication Data

US 2020/0249796 A1    Aug. 6, 2020

Related U.S. Application Data

(63) Continuation of application No. PCT/JP2018/040106, filed on Oct. 29, 2018.

(30) Foreign Application Priority Data

Dec. 13, 2017 (JP) ............................. JP2017-238573

(51) Int. Cl.
*G06F 3/044* (2006.01)
*G06F 3/047* (2006.01)
*H01L 27/32* (2006.01)

(52) U.S. Cl.
CPC ............ *G06F 3/0446* (2019.05); *G06F 3/047* (2013.01); *H01L 27/3218* (2013.01)

(58) Field of Classification Search
CPC ....... G06F 2203/04107; G06F 3/03545; G06F 3/04162; G06F 3/04164; G06F 3/0442; G06F 3/0445; G06F 3/0446
See application file for complete search history.

(56) References Cited

U.S. PATENT DOCUMENTS 9,736,933 B2 * 8/2017 Iwami ..................... B32B 15/08
9,832,862 B2 * 11/2017 Iwami ................... G06F 3/0445
(Continued)

FOREIGN PATENT DOCUMENTS

JP        2010-054905 A        3/2010
JP        2011-007889 A        1/2011
(Continued)

OTHER PUBLICATIONS

International Search Report Issued in PCT/JP2018/040106 dated Jan. 22, 2019.
(Continued)

*Primary Examiner* — Chun-Nan Lin
(74) *Attorney, Agent, or Firm* — Edwards Neils LLC; Jean C. Edwards, Esq.

(57) ABSTRACT

A conductive member is arranged on a display panel in which a plurality of pixels are arrayed in a mosaic array or a delta array, and includes a transparent insulating substrate and at least one conductive layer which has a plurality of thin metal wires and is arranged on the transparent insulating substrate, in a case of being viewed from a direction perpendicular to the transparent insulating substrate, a mesh pattern is formed by the plurality of thin metal wires, the mesh pattern is constituted by a plurality of quadrangular mesh cells having two acute angles of less than 90 degrees and two obtuse angles of more than 90 degrees, and a degree of the acute angles is 44 degrees or more and 54 degrees or less.

19 Claims, 9 Drawing Sheets

(56) References Cited

U.S. PATENT DOCUMENTS

| | | | |
|---|---|---|---|
| 10,152,163 B2* | 12/2018 | Bytheway | G06F 3/0446 |
| 10,296,152 B2* | 5/2019 | Weng | G06F 3/041661 |
| 10,592,028 B2* | 3/2020 | Clark | H01L 27/3218 |
| 10,725,600 B2* | 7/2020 | Saai | G06F 3/04164 |
| 10,782,836 B2* | 9/2020 | Kadowaki | G06F 3/0442 |
| 2015/0342034 A1* | 11/2015 | Iwami | G06F 3/0445 |
| | | | 345/174 |
| 2016/0170541 A1* | 6/2016 | Iwami | H05K 9/009 |
| | | | 345/174 |
| 2017/0131842 A1* | 5/2017 | Hashiguchi | G02F 1/13338 |
| 2017/0185187 A1* | 6/2017 | Nakayama | G06F 3/0445 |
| 2017/0185197 A1* | 6/2017 | Shepelev | G06F 3/041662 |
| 2017/0255294 A1* | 9/2017 | Shepelev | G06F 3/04182 |
| 2018/0032171 A1* | 2/2018 | Bennett | G06F 3/0443 |
| 2018/0076410 A1* | 3/2018 | Kagotani | H01L 51/5209 |
| 2018/0170541 A1* | 6/2018 | Wu | B64C 1/30 |
| 2018/0188614 A1* | 7/2018 | Yeh | G02F 1/134309 |
| 2018/0188867 A1* | 7/2018 | Yeh | G06F 3/047 |
| 2018/0261171 A1* | 9/2018 | Morein | G06F 3/044 |
| 2019/0377224 A1* | 12/2019 | Tanaka | G02F 1/133512 |
| 2020/0042154 A1* | 2/2020 | Ali | G06F 3/0446 |
| 2020/0089343 A1* | 3/2020 | Kadowaki | G06F 3/03545 |
| 2020/0104027 A1* | 4/2020 | Gourevitch | G06F 3/04164 |
| 2020/0201509 A1* | 6/2020 | Kadowaki | G06F 3/0442 |
| 2020/0225801 A1* | 7/2020 | Monson | G06F 3/0446 |

FOREIGN PATENT DOCUMENTS

| | | |
|---|---|---|
| JP | 2012-164648 A | 8/2012 |
| JP | 2015-158840 A | 9/2015 |
| WO | 2015/030090 A1 | 3/2015 |
| WO | 2016/038940 A1 | 3/2016 |

OTHER PUBLICATIONS

Written Opinion Issued in PCT/JP2018/040106 dated Jan. 22, 2019.
International Preliminary Report on Patentability Issued in PCT/JP2018/040106 dated Jun. 16, 2020.

* cited by examiner

CONDUCTIVE MEMBER, TOUCH PANEL, AND DISPLAY DEVICE

CROSS-REFERENCE TO RELATED APPLICATIONS

This application is a Continuation of PCT International Application No. PCT/JP2018/040106 filed on Oct. 29, 2018, which was published under PCT Article 21(2) in Japanese, and which claims priority under 35 U.S.C. § 119(a) to Japanese Patent Application No. 2017-238573 filed on Dec. 13, 2017. The above applications are hereby expressly incorporated by reference, in their entirety, into the present application.

BACKGROUND OF THE INVENTION

1. Field of the Invention

The present invention relates to a conductive member arranged on a display panel in which a plurality of pixels are arrayed in a mosaic array or a delta array, a touch panel including the conductive member, and a display device.

2. Description of the Related Art

In recent years, touch panels which are used by being combined with a display device such as a liquid crystal display device in various kinds of electronic devices including portable information devices such as tablet computers and smartphones, and perform an input operation into the electronic devices by causing a finger, a stylus pen, or the like to be contact with or be close to a screen have become popular.

A touch panel typically has a conductive member on which a plurality of detection electrodes and the like for detecting a touch operation with a finger, a stylus pen, or the like are formed. The detection electrode is often formed of a transparent conductive oxide such as indium tin oxide (ITO) but is also formed of a metal other than the transparent conductive oxide. The metal has advantages such as easier patterning, superior bendability, and a lower resistance value as compared with the transparent conductive oxide. Since a resistance value and a parasitic capacitance value can be reduced in a touch panel having a conductive member constituted using thin metal wires compared with a conventional touch panel constituted using a transparent conductive oxide, the detection sensitivity to a touch operation can be improved and attraction has been drawn.

In a case where a conductive member constituted using thin metal wires is arranged on a display panel of a liquid crystal display device or the like, generally, moire generated due to interference between the thin metal wire and a pixel pattern of the display panel is remarkably visually recognized and thus various measures have been taken to reduce the moire. For example, JP2012-164648A discloses a conductive member in which a rhombic mesh pattern constituted by a plurality of thin metal wires is formed on a transparent insulating substrate, and the inner angle of the rhombus is set to 60 degrees to 120 degrees.

SUMMARY OF THE INVENTION

However, in a display panel of a liquid crystal display device or the like which has been widely used in the related art, by arranging three sub-pixels in parallel inside each of a plurality of pixels arrayed, a plurality of pixels are arrayed in a so-called stripe array in which the same sub-pixels are aligned in a stripe shape in many cases. The conductive member disclosed in JP2012-164648A is used for a display panel in which a plurality of pixels are arrayed in a stripe array to reduce moire. However, in an organic electroluminescence (EL) display panel that has become popular in recent years, by arranging three sub-pixels to be located at the vertices of the triangle inside each of a plurality of pixels arrayed, the plurality of pixels are arrayed in a so-called mosaic array or a delta array in which sub-pixels of the same color are aligned in an oblique direction in many cases. In a case where the conductive member disclosed in JP2012-164648A is used for such a display panel, there is a problem that moire is remarkably visually recognized.

The present invention has been made in order to solve such a problem in the related art, and an object thereof is to provide a conductive member capable of reducing moire in a display panel in which a plurality of pixels are arrayed in a mosaic array and a delta array, a touch panel, and a display device.

A conductive member according to the present invention is a conductive member includes: a transparent insulating substrate; and at least one conductive layer which has a plurality of thin metal wires and is arranged on the transparent insulating substrate, in which in a case of being viewed from a direction perpendicular to the transparent insulating substrate, a mesh pattern is formed by the plurality of thin metal wires, the mesh pattern is constituted by a plurality of quadrangular mesh cells having two acute angles of less than 90 degrees and two obtuse angles of more than 90 degrees, and a degree of the acute angles is 44 degrees or more and 54 degrees or less.

Further, it is preferable that the degree of the acute angles of the conductive member is 46 degrees or more and 50 degrees or less. In addition, it is preferable that the quadrangular mesh cell in the conductive member has a shape of rhombus.

It is preferable that a length of one side of the rhombus is 168 μm or more and 248 μm or less. It is more preferable that the length of one side of the rhombus is 168 μm or more and 192 μm or less. In addition, it is preferable that a line width of the thin metal wire in the conductive member is 1 μm or more and 4 μm or less.

Two layers of the conductive layers may be arranged on the transparent insulating substrate, and the plurality of thin metal wires of the two conductive layers may be combined with each other to form the mesh pattern. Further, the two conductive layers may be respectively arranged on both surfaces of the transparent insulating substrate to face each other. Alternatively, the two conductive layers may be arranged on one surface of the transparent insulating substrate so as to overlap each other. Further, an interlayer transparent insulating layer may be provided between the two conductive layers.

A touch panel according to the present invention is a touch panel using the above conductive member.

Further, a display device according to the present invention includes a display panel in which a plurality of pixels are arrayed in a mosaic array or a delta array; and a conductive member including a transparent insulating substrate, and at least one conductive layer which has a plurality of thin metal wires and is arranged on the transparent insulating substrate, in which in a case of being viewed from a direction perpendicular to the transparent insulating substrate, a mesh pattern is formed by the plurality of thin metal wires, the mesh pattern is constituted by a plurality of quadrangular mesh cells having two acute angles of less than 90 degrees and two obtuse angles of more than 90 degrees, and a degree of the acute angles is 44 degrees or more and 54 degrees or less.

Further, it is preferable that the plurality of pixels have an array direction in which a plurality of sub-pixels are arrayed so as to repeat an order of a red pixel R, a green pixel G, and a blue pixel B, the quadrangular mesh cells are rhombic mesh cells, and the array direction and a direction along the bisector of the acute angles of the rhombic mesh cells match with each other. It is preferable that the degree of the acute angles in the display device is 46 degrees or more and 50 degrees or less.

It is preferable that a length of one side of the rhombus is 168 μm or more and 248 μm or less. It is more preferable that the length of one side of the rhombus is 168 μm or more and 192 μm or less. In addition, it is preferable that a line width of the thin metal wire in the display device is 1 μm or more and 4 μm or less. It is preferable that two layers of the conductive layers are arranged on the transparent insulating substrate, and the plurality of thin metal wires of the two conductive layers are combined with each other to form the mesh pattern.

The conductive member in the display device may constitute a touch panel. The plurality of pixels in the display device may be constituted by organic EL elements. In addition, it is preferable that a pixel pitch of the plurality of pixels in the display device is 40 μm or more and 110 μm or less.

According to the present invention, since a mesh pattern is formed by the plurality of thin metal wires in a case of being viewed from a direction perpendicular to the transparent insulating substrate, the mesh pattern is constituted by the plurality of quadrangular mesh cells having two acute angles of less than 90 degrees and two obtuse angles of more than 90 degrees, and the degree of the acute angles is 44 degrees or more and 54 degrees or less, it is possible to reduce moire in a display panel in which a plurality of pixels are arrayed in a mosaic array and a delta array.

DESCRIPTION OF THE PREFERRED EMBODIMENTS

Hereinafter, a conductive member according to an embodiment of the present invention will be described in detail based on preferred embodiments shown in the accompanying drawings. Hereinafter, the expression "to" indicating a numerical range includes numerical values described on both sides. For example, the expression "s is a numerical value t1 to a numerical value t2" means that the range of s includes the numerical value t1 and the numerical value t2, and t1≤s≤t2 in mathematical symbols. Unless otherwise specified, angles including "orthogonal" and "parallel" include error ranges generally accepted in the technical field. The term "transparent" means that the light transmittance is at least 40% or more, preferably 75% or more, more preferably 80% or more, and still more preferably 90% or more in a visible light wavelength range of 400 to 800 nm. The light transmittance is measured using, for example, "Plastics-A Method of Obtaining Total Light Transmittance and Total Light Reflectance" defined by JIS K7375: 2008.

EMBODIMENTS

Figure 1:
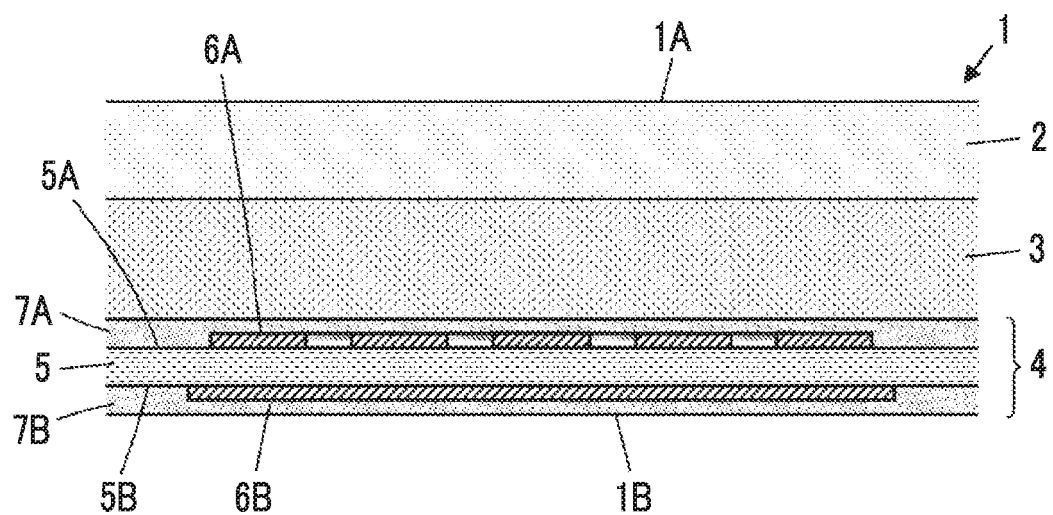
FIG. 1 is a partial cross-sectional view of a touch panel according to an embodiment of the present invention.

FIG. 1 shows a configuration of a touch panel 1 according to an embodiment of the present invention. The touch panel 1 has a front surface 1A and a back surface 1B, and a display panel described later is arranged on the back surface 1B side to constitute a display device. The front surface 1A of the touch panel 1 is a touch surface for detecting a touch operation, and is a viewing side where an operator of the touch panel 1 observes an image displayed on the display device through the touch panel 1. The touch panel 1 has a transparent insulating cover panel 2 arranged on the front surface 1A side, and a conductive member 4 is bonded onto a surface of the cover panel 2 opposite to the front surface 1A via a transparent adhesive layer 3.

The conductive member 4 has a transparent insulating substrate 5, and the transparent insulating substrate 5 has a first surface 5A facing the front surface 1A side of the touch panel 1 and a second surface 5B facing a side opposite to the first surface 5A. A first conductive layer 6A is formed on the first surface 5A, and a second conductive layer 6B is formed on the second surface 5B of the transparent insulating substrate 5. As shown in FIG. 1, a transparent protective layer 7A covering the first conductive layer 6A and a transparent protective layer 7B covering the second conductive layer 6B may be formed.

Figure 2:
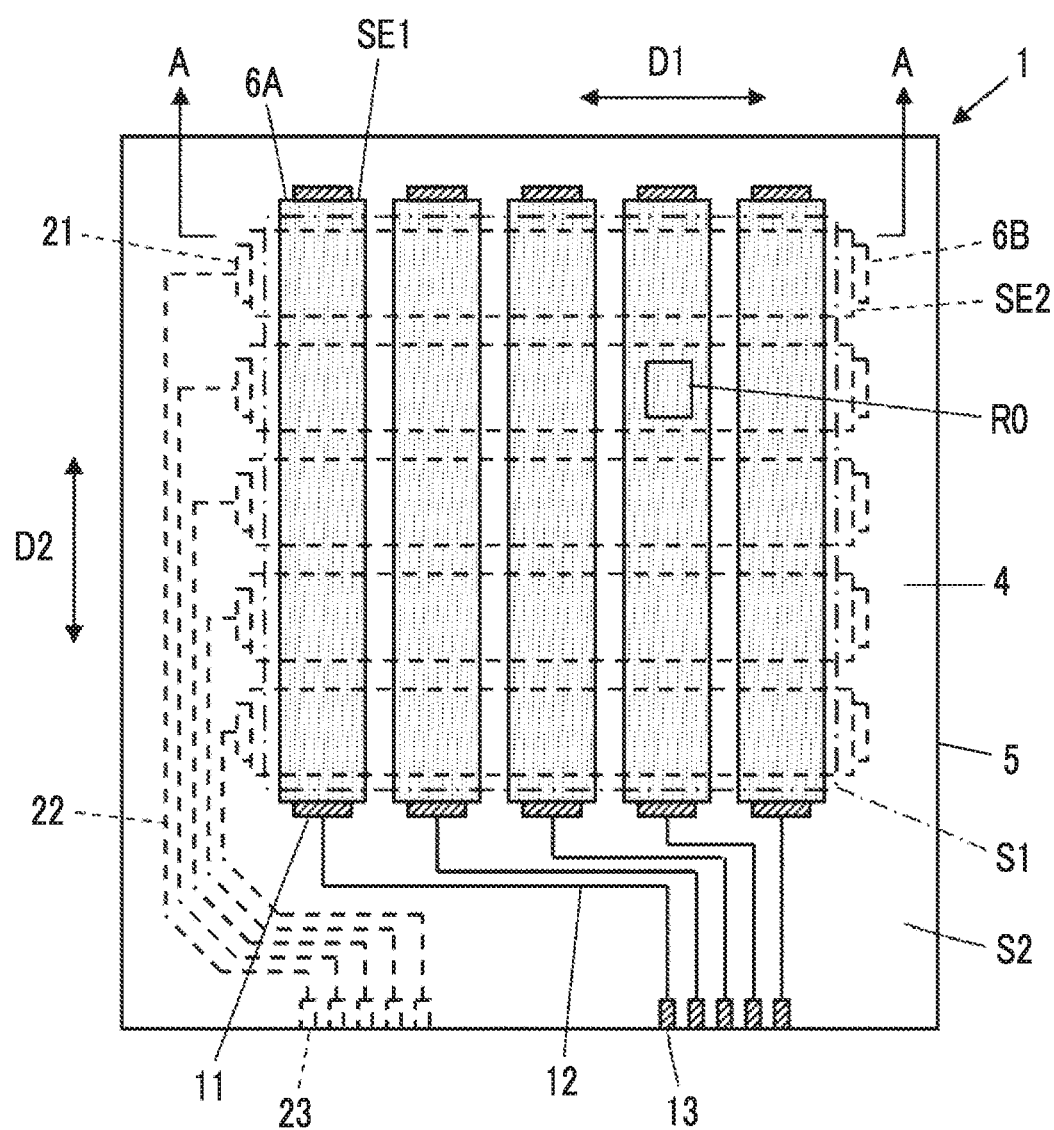
FIG. 2 is a plan view of the touch panel according to the embodiment of the present invention.

FIG. 2 is a plan view of the touch panel 1 when viewed from the viewing side in plan view. FIG. 1 is a cross-sectional view taken along line A-A in FIG. 2. In addition, in FIG. 2, the cover panel 2, the adhesive layer 3, the protective layer 7A, and the protective layer 7B are omitted for the sake of explanation. As shown in FIG. 2, the conductive member 4 of the touch panel 1 is partitioned into an input region S1 for detecting a touch operation by a finger and a stylus pen, and an outer region S2 located outside the input region S1.

The first conductive layer 6A formed on the first surface 5A of the transparent insulating substrate 5 has a plurality of first detection electrodes SE1 which are arranged to be parallel in a first direction D1 at intervals and extend in a second direction D2 orthogonal to the first direction D1. In addition, the first conductive layer 6A further has a plurality of first electrode pads 11 respectively connected to one end of each of the plurality of first detection electrodes SE1, a plurality of first peripheral wirings 12 connected to each of the plurality of first electrode pads 11, and a plurality of first external connection terminals 13 connected to each of the plurality of first peripheral wirings 12 and formed to be arrayed at the edge portion of the first surface 5A of the transparent insulating substrate 5. As the shape of the first electrode pad 11, for example, the shape of the electrode terminal disclosed in JP2013-127657A can be used.

Here, the first detection electrode SE1 may include the same electrode pad as the first electrode pad 11 even at the end portion to which the first peripheral wiring 12 is not electrically connected via the first electrode pad 11. This electrode pad can also be used as a terminal for connecting the first peripheral wiring 12, and can also be used as a terminal for conduction inspection of the first detection electrode SE1.

The second conductive layer 6B formed on the second surface 5B of the transparent insulating substrate 5 has a plurality of second detection electrodes SE2 that are arranged to be parallel at intervals in the second direction D2 and extend in the first direction D1. As shown in FIG. 2, the plurality of second detection electrodes SE2 are arranged so as to intersect and overlap with the plurality of first detection electrodes SE1 in the input region S1 when viewed from the viewing side.

In addition, the second conductive layer 6B further has a plurality of second electrode pads 21 respectively connected to one end of each of the plurality of second detection electrodes SE2 respectively, a plurality of second peripheral wirings 22 connected to each of the plurality of second electrode pads 21, and a plurality of second external connection terminals 23 connected to each of the plurality of second peripheral wirings 22 and formed to be arrayed at the edge portion of the second surface 5B of the transparent insulating substrate 5. Here, the second detection electrode SE2 may include the same electrode pad as the second electrode pad 21 even at the end portion to which the second peripheral wiring 22 is not electrically connected via the second electrode pad 21. This electrode pad can also be used as a terminal for connecting the second peripheral wiring 22, and can also be used as a terminal for conduction inspection of the second detection electrode SE2. As the shape of the second electrode pad 21, similar to the first electrode pad 11, for example, the shape of the electrode terminal disclosed in JP2013-127657A can be used.

Figure 3:
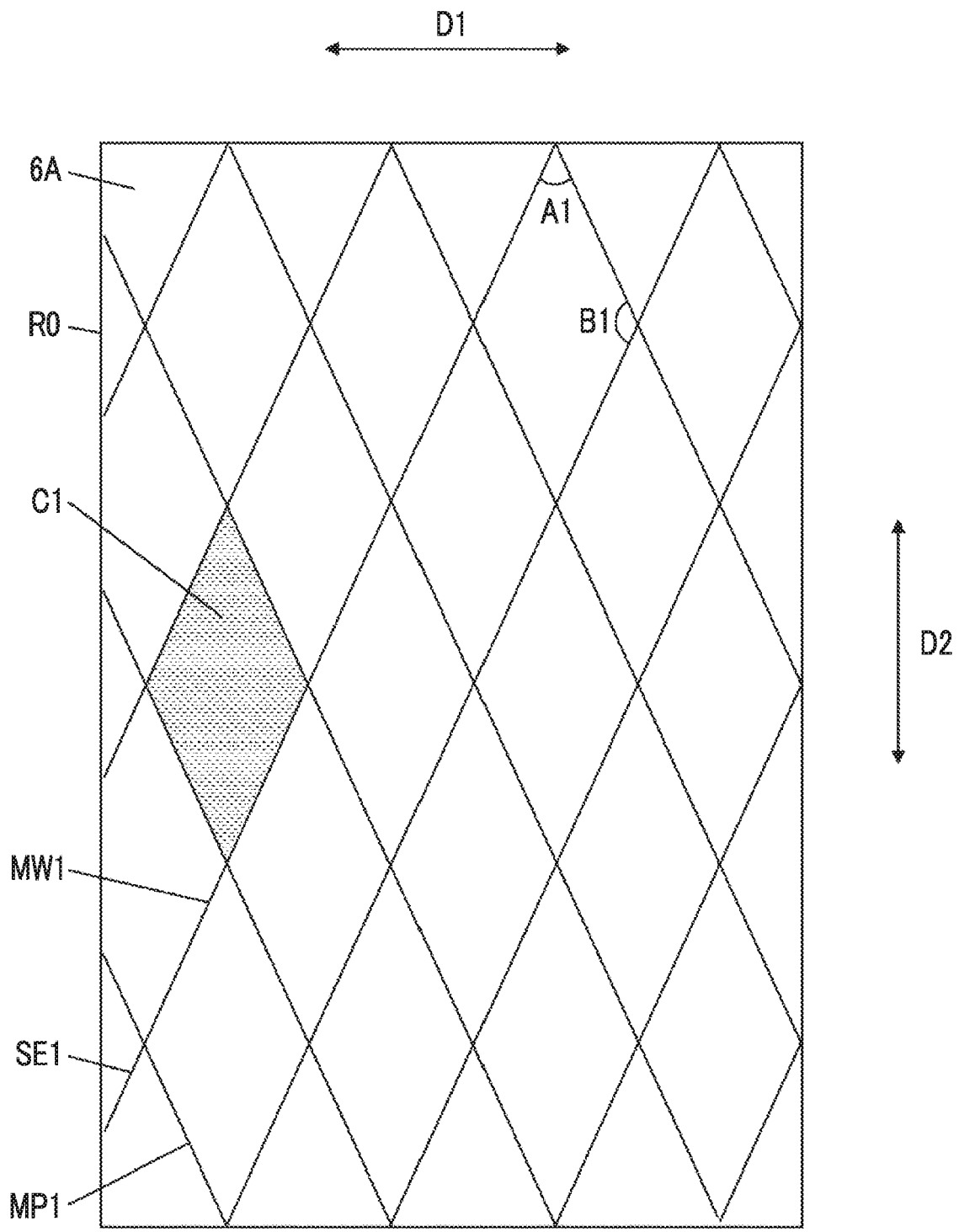
FIG. 3 is a partially enlarged plan view of a first conductive layer in the embodiment of the present invention.

FIG. 3 is a partial plan view when only the first conductive layer 6A is viewed from the viewing side in plan view in a region R0 where the first detection electrode SE1 and the second detection electrode SE2 overlap each other. As shown in FIG. 3, the first detection electrode SE1 is constituted by a plurality of thin metal wires MW1, and a first mesh pattern MP1 is formed by the plurality of thin metal wires MW1. The first mesh pattern MP1 has a rhombic first mesh cell C1 having two acute angles A1 and two obtuse angles B1 as repeating units.

In addition, the line width of the thin metal wire MW1 is 0.5 μm or more and 10 μm or less, and preferably 1 μm or more and 4 μm or less. By setting the line width of the thin metal wire MW1 within this range, it is possible to prevent the thin metal wire MW1 from being remarkably visually recognized in a case where the conductive member 4 is viewed from the viewing side.

Figure 4:
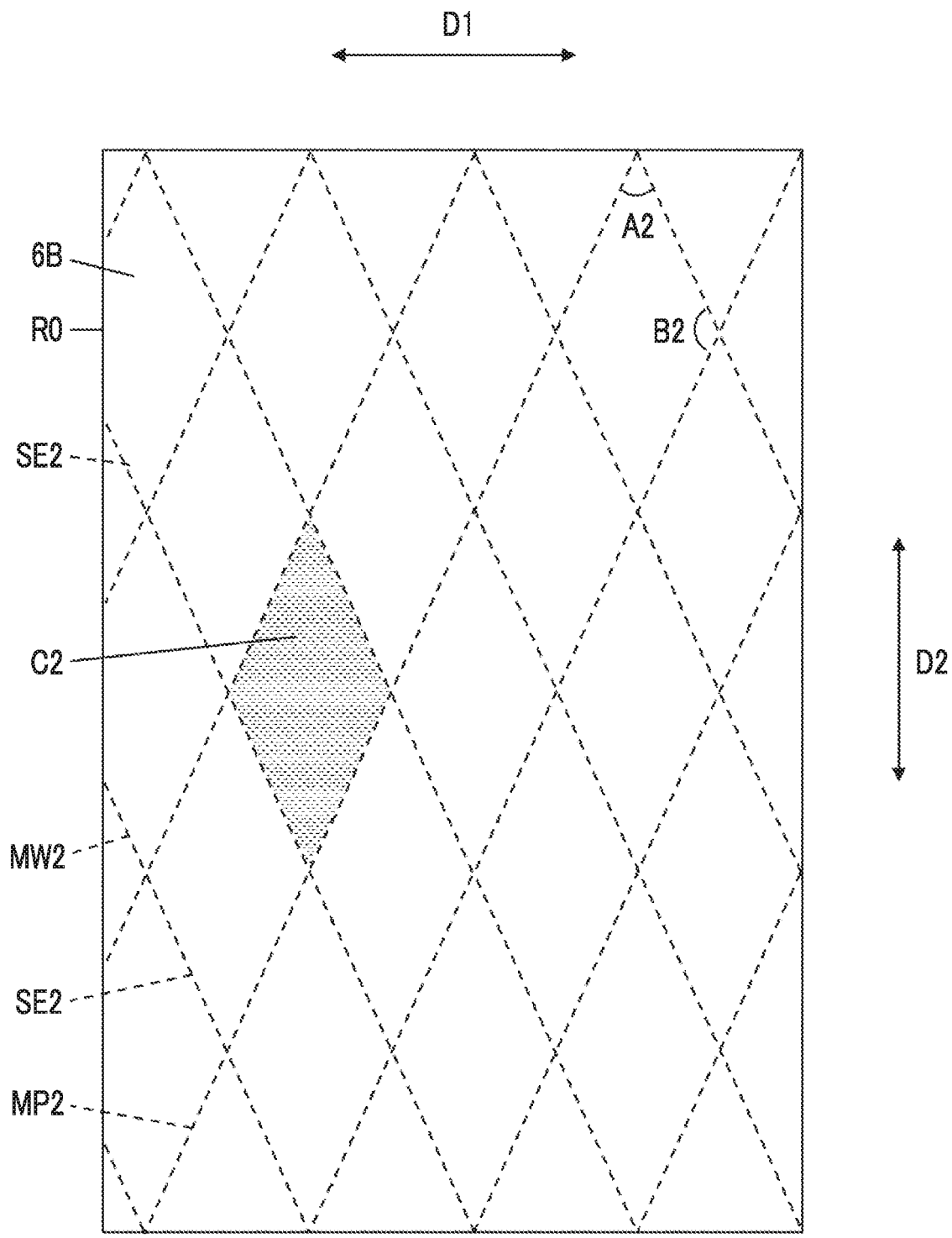
FIG. 4 is a partially enlarged plan view of a second conductive layer according to the embodiment of the present invention.

FIG. 4 is a partial plan view when only the second conductive layer 6B is viewed from the viewing side in plan view in the region R0. As shown in FIG. 4, the second detection electrode SE2 is constituted by a plurality of thin metal wires MW2, and a second mesh pattern MP2 is formed by the plurality of thin metal wires MW2. The second mesh pattern MP2 has a rhombic second mesh cell C2 having two acute angles A2 and two obtuse angles B2 as repeating units. Here, the degree of the two acute angles A2 of the second mesh cell C2 is the same as the degree of the two acute angles A1 of the first mesh cell C1, and the degree of the two obtuse angles B2 of the second mesh cell C2 is the same as the degree of the two obtuse angles B1 of the first mesh cell C1. Further, the line width of the thin metal wire MW2 is 0.5 μm or more and 10 μm or less, preferably 1 μm or more and 4 μm or less, similar to the line width of the thin metal wire MW1. In addition, for the sake of explanation, in FIG. 4, the thin metal wire MW2 constituting the second detection electrode SE2 is drawn by a broken line, but is actually a continuous thin metal wire.

Figure 5:
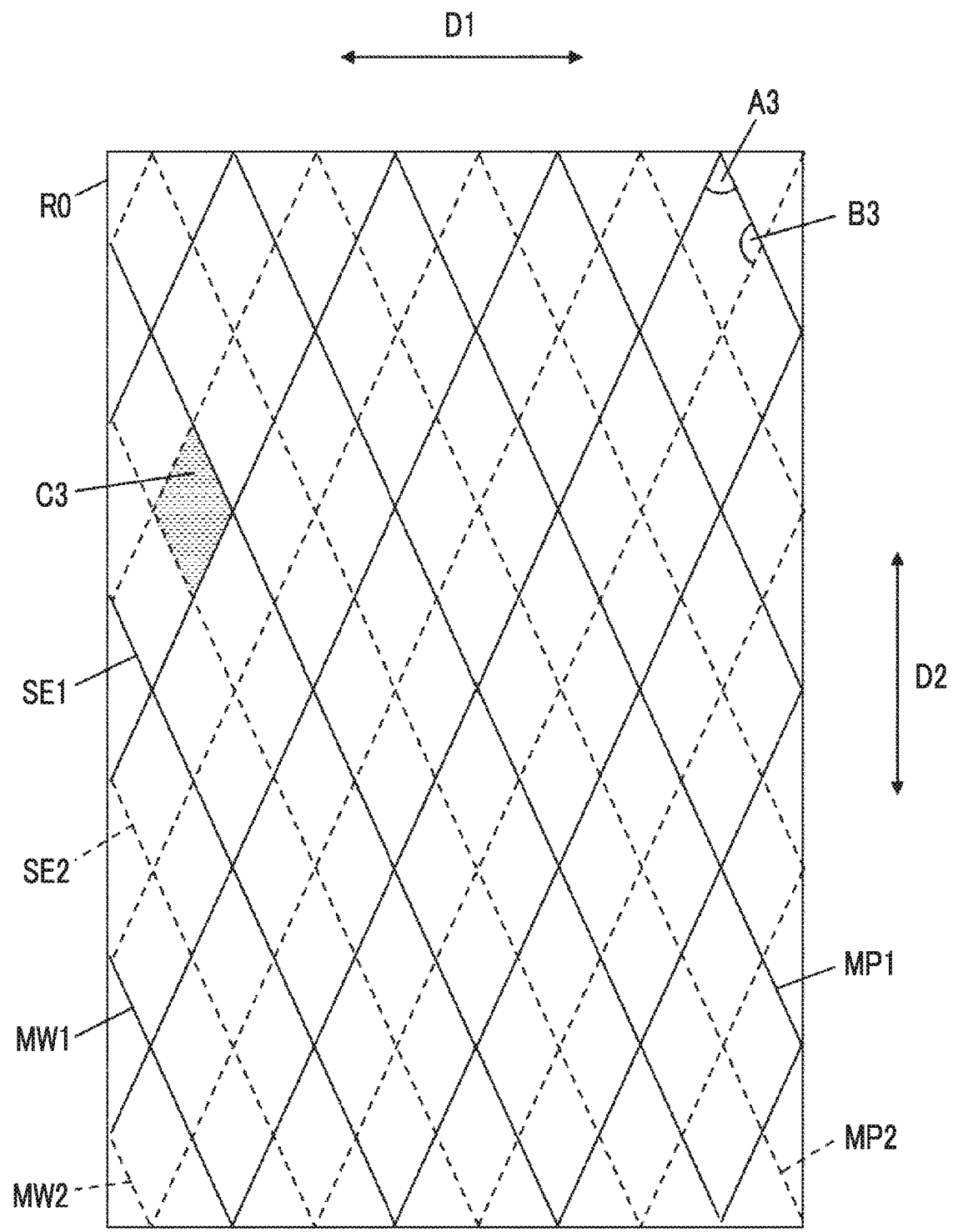
FIG. 5 is a partially enlarged plan view of a conductive member according to the embodiment of the present invention.

FIG. 5 shows a partial plan view when the conductive member 4 of the embodiment is viewed from the viewing side in plan view in the region R0, that is, when the conductive member is viewed from a direction perpendicular to the transparent insulating substrate 5. As shown in FIG. 5, in the conductive member 4, the first detection electrode SE1 and the second detection electrode SE2 are combined with each other, that is, the first mesh pattern MP1 and the second mesh pattern MP2 are combined with each other to form a third mesh pattern MP3. The third mesh pattern MP3 is constituted by a rhombic third mesh cell C3 having two acute angles A3 and two obtuse angles B3.

Here, in FIG. 5, the first mesh pattern MP1 and the second mesh pattern MP2 are arranged to be shifted from each other in the first direction D1 such that the vertex of the rhombic first mesh cell C1 matches with the center of the rhombic second mesh cell C2, that is, the midpoint of the side of the first mesh cell C1 matches with the midpoint of the second mesh cell C2. Therefore, the third mesh cell C3 has one side with half the length of one side of the first mesh cell C1 and half the length of one side of the second mesh cell C2, and the first mesh cell C1 and the second mesh cell C2 have shapes similar to each other.

Therefore, the degree of the two acute angles A3 of the third mesh cell C3 in the embodiment shown in FIG. 5 is the same as the degree of the acute angles A1 of the first mesh cell C1, and the degree of the two obtuse angles B3 of the third mesh cell C3 is the same as the degree of the obtuse angles B1 of the first mesh cell C1. In the present invention, by setting the degree of the acute angles A3 of the third mesh cell C3 to 44 degrees or more and 54 degrees or less, and more preferably 46 degrees or more and 50 degrees or less, moire can be reduced in a display panel in which a plurality of pixels are arrayed in a mosaic array or a delta array. The present inventors have conducted experiments showing such results, and the experiment results will be described later in detail.

In the present invention, the mosaic array or the delta array refers an array in which sub-pixels of the same color are aligned in an oblique direction by arranging three sub-pixels to be located at the vertices of the triangle inside each of the plurality of pixels arrayed. This mosaic array or delta array will be described later in detail.

The length of one side of the third mesh cell C3 is preferably 168 μm or more and 248 μm or less, and more preferably 168 μm or more and 192 μm or less. By setting the length of one side of the third mesh cell C3 within this range, as shown in the experimental results described later, moire can be reduced in a display panel in which a plurality of pixels are arrayed in a mosaic array or a delta array.

Figure 6:
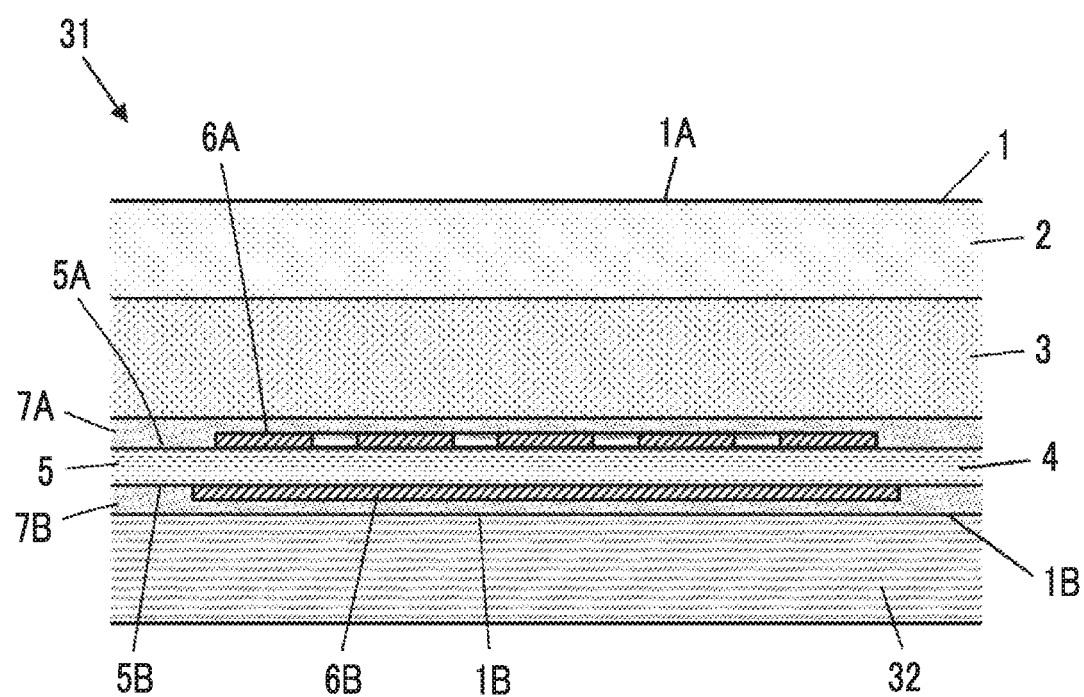
FIG. 6 is a partial cross-sectional view schematically showing a display device according to an embodiment of the present invention.
Figure 7:
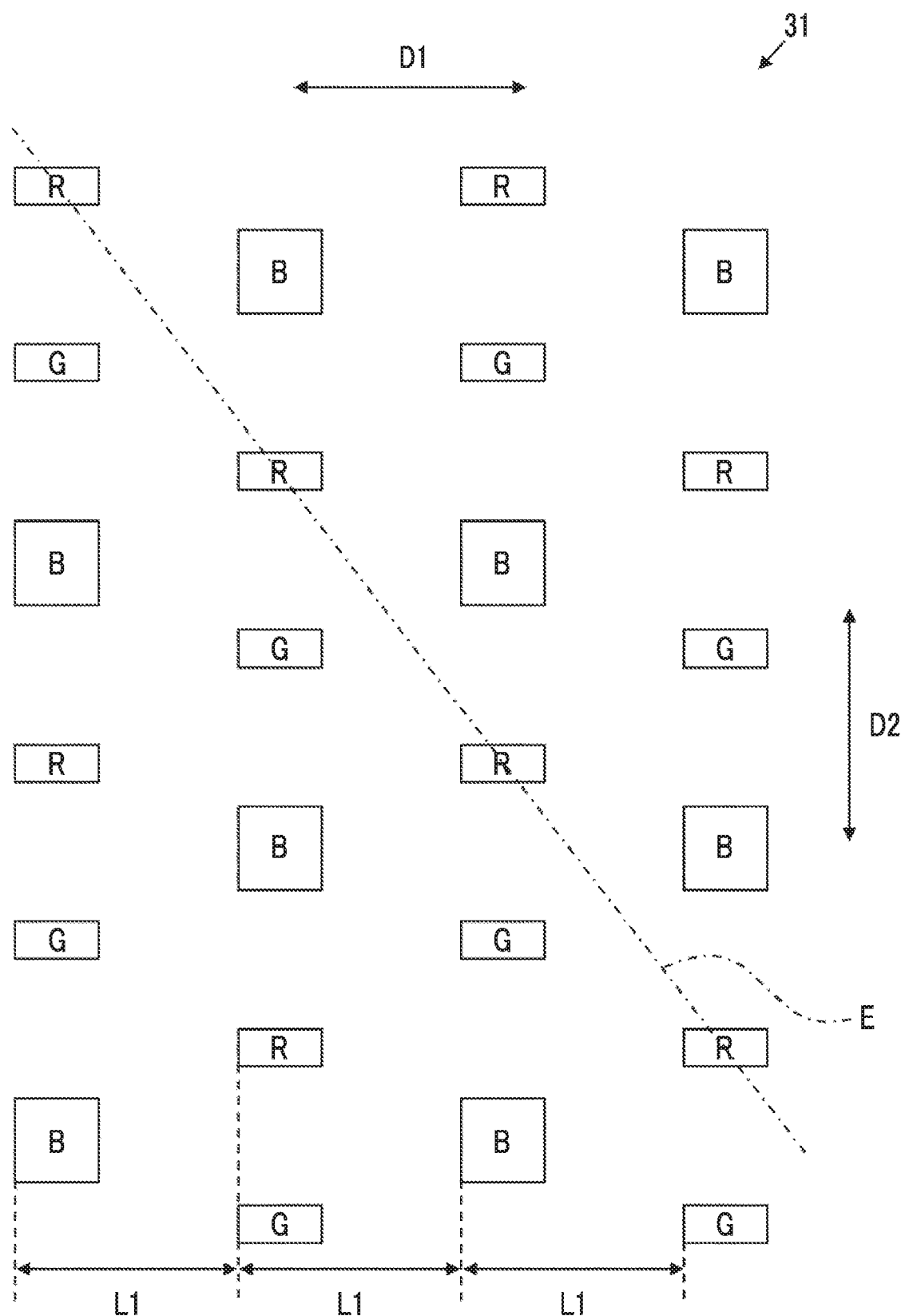
FIG. 7 is a view showing an example of an array of sub-pixels of the display panel according to the embodiment of the present invention.

Next, a display panel in which the touch panel 1 and the conductive member 4 according to the embodiment are arranged will be described with reference to examples shown in FIGS. 6 to 8. As schematically shown in FIG. 6, a display device 31 according to an embodiment of the present invention is constituted by arranging the touch panel 1 on a display panel 32. At this case, the touch panel 1 is arranged on the display panel 32 such that the back surface 1B of the touch panel 1 faces the display panel 32. The display panel 32 on which the touch panel 1 according to the embodiment of the present invention is arranged has a plurality of red pixels R, green pixels G, and blue pixels B as sub-pixels as shown in FIG. 7.

The plurality of red pixels R, green pixels G, and blue pixels B are arrayed so as to repeat the order of the red pixel R, the green pixel G, and the blue pixel B in the second direction D2, and the arrays of the sub-pixels arrayed in this manner are arranged at every array interval L1 in the first direction D1. Further, in the arrays in which the plurality of red pixels R, green pixels G, and blue pixels B are adjacent to each other in the first direction D1, the pixels are arranged at positions shifted from each other in the second direction D2. Thus, the plurality of sub-pixels of the same color, that is, the plurality of red pixels R, the plurality of green pixels G, and the plurality of blue pixels B are respectively arrayed in a direction parallel to an array axis E inclined with respect to the first direction D1 and the second direction D2. In the present invention, the arrays of the plurality of sub-pixels are referred to as a mosaic array or a delta array. In a so-called organic EL display panel in which a plurality of pixels are constituted by organic EL elements, a plurality of pixels are arrayed in a mosaic array or a delta array in many cases.

Figure 8:
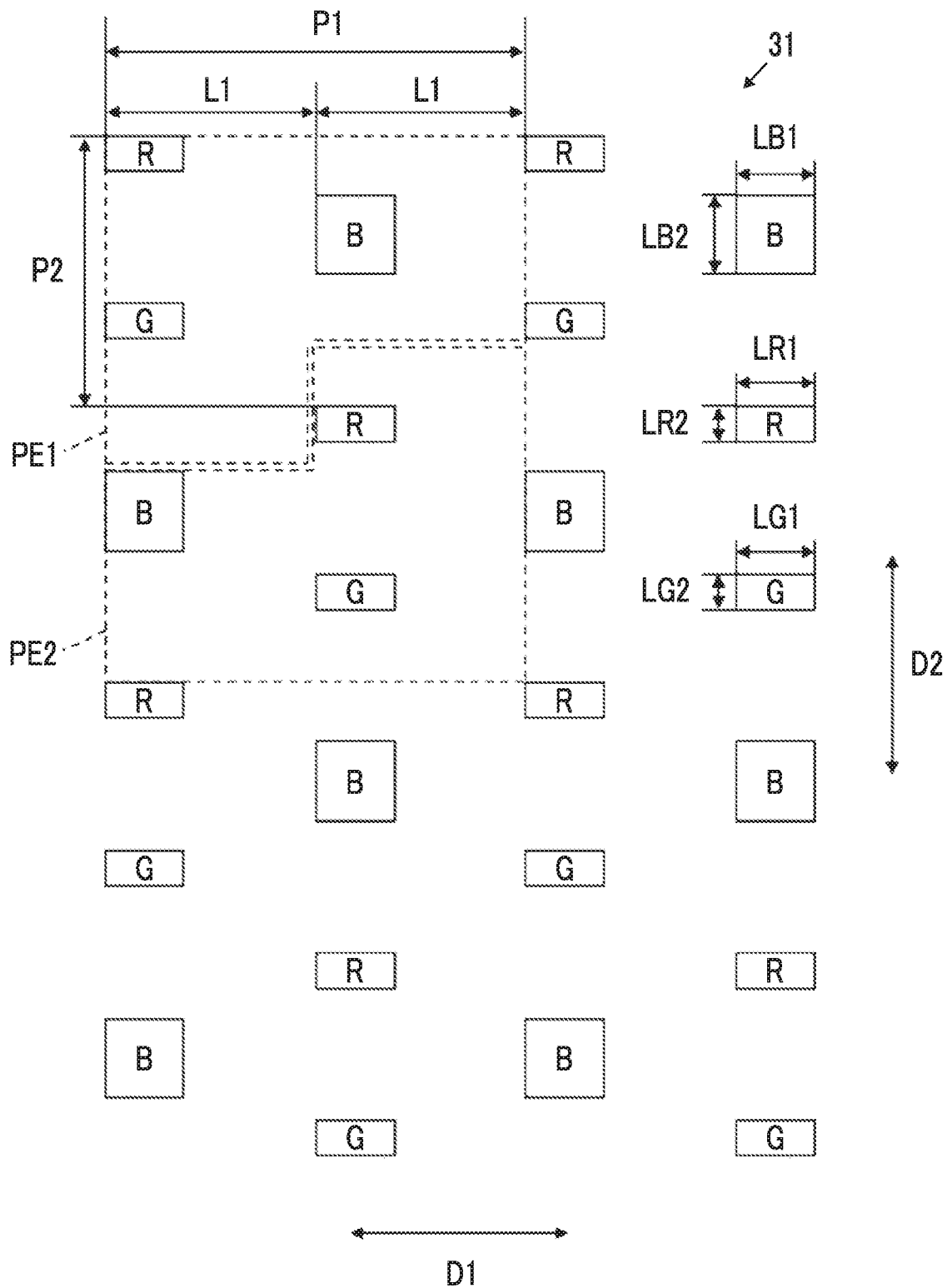
FIG. 8 is a diagram illustrating an example of an array of pixels of the display panel according to the embodiment of the present invention.

In addition, as shown in FIG. 8, such a mosaic array or delta array is constituted by two kinds of pixels PE1 and PE2. The pixels PE1 and PE2 have the same size and shape as each other, and have directions rotated by 180 degrees from each other. In the first direction D1, the same pixels PE1 or PE2 are arrayed in parallel so as to be adjacent to each other, and in the second direction D2, the pixels PE1 and PE2 are alternately arrayed in parallel.

These pixels PE1 and PE2 each have three sub-pixels of a red pixel R, a green pixel G, and a blue pixel B, as shown in FIG. 8. Specifically, the pixels PE1 and PE2 each have a red pixel R and a green pixel G adjacent to each other in the second direction D2, and a blue pixel B adjacent to the red pixel R and the green pixel G in the first direction D1.

Here, as the pixel pitches of the pixels PE1 and PE2, a first direction pixel pitch P1 in the first direction D1 and a second direction pixel pitch P2 in the second direction D2 are determined. In the example shown in FIG. 8, the first direction pixel pitch P1 is an arrangement pitch of the same sub-pixels in the first direction D1, and the second direction pixel pitch P2 is an arrangement pitch of the same sub-pixels in the second direction D2. The first direction pixel pitch P1 is twice the array interval L1 of the sub-pixels adjacent to each other.

In addition, it is preferable that the first direction pixel pitch P1 and the second direction pixel pitch P2 are 40 μm or more and 110 μm or less. In a case where the first direction pixel pitch P1 and the second direction pixel pitch P2 are set to values within this range, moire generated by interference between the third mesh pattern MP3 formed on the touch panel 1 and the conductive member 4 according to the embodiment of the present invention and the pattern of the pixels included in the display panel 32 can be further reduced.

In the example shown in FIG. 8, the red pixel R has a horizontal width LR1 in the first direction D1 and a vertical width LR2 in the second direction D2, the green pixel G has a horizontal width LG1 in the first direction D1 and a vertical width LG2 in the second direction D2, and the blue pixel B has a horizontal width LB1 in the first direction D1 and a vertical width LB2 in the second direction D2.

As described above, according to the touch panel 1 and the conductive member 4 of the embodiment, it is possible to reduce moire in a display panel in which a plurality of pixels are arrayed in a mosaic array or a delta array. Particularly, as shown in FIGS. 5 and 7, it is preferable to arrange the conductive member 4 on the display panel 32 such that the direction of the acute angles A3 of the third mesh cell C3 (the direction along the bisector of the acute angles A3; the second direction D2 in FIG. 5), and the direction in which the plurality of sub-pixels are arrayed in the display panel 32 so as to repeat the order of the red pixel R, the green pixel G, and the blue pixel B (the second direction D2 in FIG. 7) match with each other since moire can be more effectively reduced.

In the embodiment of the present invention, the third mesh pattern MP3 formed by overlapping the first conductive layer 6A and the second conductive layer 6B each other is constituted by the plurality of rhombic third mesh cells C3, but the shape of the third mesh cell C3 is not limited to a shape of rhombus as long as the shape is a quadrangular shape which has two acute angles A3 of less than 90 degrees and two obtuse angles B3 of more than 90 degrees and in which the degree of the two acute angles A3 is 44 degrees or more and 54 degrees or less. Even in a case where the third mesh cell C3 has such a quadrangular shape, it is possible to reduce moire in a display panel in which a plurality of pixels are arrayed in a mosaic array or a delta array. However, it is preferable that the third mesh cell C3 has a shape of rhombus since moire can be more effectively reduced. Particularly, it is more preferable that the third mesh cell C3 has a shape of rhombus, and as shown in FIGS. 5 and 7, the conductive member 4 is arranged on the display panel 32 such that the direction of the acute angles A3 of the third mesh cell C3 (the second direction D2 in FIG. 5), and the direction in which the plurality of sub-pixels are arrayed in the display panel 32 so as to repeat the order of the red pixel R, the green pixel G, and the blue pixel B (the second direction D2 in FIG. 7) match with each other since moire can be most effectively reduced.

In the embodiment of the present invention, the degree of the two acute angles A1 of the first mesh cell C1 constituting the first mesh pattern MP1 and the degree of the two acute angles A2 of the second mesh cell C2 constituting the second mesh pattern MP2 are the same as each other, but as long as the degree of the two acute angles A3 of the third mesh cell C3 constituting the third mesh pattern MP3 is 44 degrees or more and 54 degrees or less, the degree of the two acute angles A1 of the first mesh cell C1 may be different from the degree of the two acute angles A2 of the second mesh cell C2.

In addition, as long as the third mesh cell C3 has a quadrangular shape which has two acute angles of less than 90 degrees and two obtuse angles of more than 90 degrees and in which the degree of the two acute angles is 44 degrees or more and 54 degrees or less, the pattern formed by the thin metal wire MW1 on the first detection electrode SE1 and the pattern formed by the thin metal wire MW2 on the second detection electrode SE2 are not limited to the rhombic mesh pattern. In this case, for example, although not shown, the pattern formed by the thin metal wire MW1 on the first detection electrode SE1 and the pattern formed by the thin metal wire MW2 on the second detection electrode SE2 can be designed to form a mesh pattern constituted by quadrangular mesh cells other than the plurality of rhombuses.

Although not shown, in this case, the third mesh cell C3 can be constituted by the first mesh cell C1, the second mesh cell C2, and electrode-internal dummy pattern portions that are constituted by a thin metal wire and respectively provided inside the first mesh cell C1 and the second mesh cell C2 by providing the electrode-internal dummy pattern portions inside each of the first mesh cell C1 and the second mesh cell C2.

For example, although not shown, a first electrode-internal dummy pattern portion provided inside the first mesh cell C1 can be constituted by a thin metal wire that is arranged at an interval from the thin metal wire MW1 constituting the first mesh cell C1 to be insulated from the thin metal wire MW1 and to be parallel to the side of the first mesh cell C1. In addition, for example, although not shown, a second electrode-internal dummy pattern portion provided inside the second mesh cell C2 can be constituted by a thin metal wire that is arranged at an interval from the thin metal wire MW2 constituting the second mesh cell C2 to be insulated from the thin metal wire MW2 and to be parallel to the side of the second mesh cell C2. Thus, the first electrode-internal dummy pattern portion and the second electrode-internal dummy pattern portion can be constituted such that the third mesh pattern cell C3 having a quadrangular shape which has two acute angles of less than 90 degrees and two obtuse angles of more than 90 degrees and in which the degree of the two acute angles is 44 degrees or more and 54 degrees or less is formed by the first mesh cell C1, the first electrode-internal dummy pattern portion, the second mesh cell C2, and the second electrode-internal dummy pattern portion.

In addition, as long as the third mesh cell C3 has a quadrangular shape which has two acute angles of less than 90 degrees and two obtuse angles of more than 90 degrees and in which the degree of the two acute angles is 44 degrees or more and 54 degrees or less, a mesh pattern may not be formed in each of the first detection electrode SE1 and the second detection electrode SE2. In this case, for example, the thin metal wire MW1 and the thin metal wire MW2 can be designed to have a plurality of wavy patterns or a plurality of bending line patterns extending substantially in the first direction D1 and the second direction D2, respectively. Examples of such patterns are disclosed in JP2016-126731A.

Although not shown, dummy electrodes insulated from the plurality of first detection electrodes SE1 and the plurality of second detection electrodes SE2 can be arranged between the plurality of first detection electrodes SE1 arranged to be parallel in the first direction D1, and between the plurality of second detection electrodes SE2 arranged to be parallel in the second direction D2, respectively.

In this case, the dummy electrode arranged on the first conductive layer 6A is insulated from the first detection electrode SE1 by being arranged at an interval from the first detection electrode SE1. In addition, similar to the first detection electrode SE1, it is preferable that the dummy electrode arranged on the first conductive layer 6A is constituted by the thin metal wire MW1 and has the same pattern as the pattern formed by the thin metal wire MW1 on the first detection electrode SE1. In addition, the dummy electrode arranged on the second conductive layer 6B is insulated from the second detection electrode SE2 by being arranged at an interval from the second detection electrode SE2. In addition, similar to the second detection electrode SE2, it is preferable that the dummy electrode arranged on the second conductive layer 6B is constituted by the thin metal wire MW2 and has the same pattern as the pattern formed by the thin metal wire MW2 in the second detection electrode SE2. Thus, in a case where the conductive member 4 is arranged on the display panel 32, the gap between the plurality of first detection electrodes SE1 and the gap between the plurality of second detection electrodes SE2 can be prevented from being remarkably visually recognized. In addition, a disconnection portion may be provided in the thin metal wire arranged in the dummy electrode. It is preferable that the interval between the dummy electrode and the first detection electrode SE1, the interval between the dummy electrode and the second detection electrode SE2, and the length of the disconnection portion provided in the dummy electrodes are 5 μm or more and 20 μm or less, respectively.

Further, in the embodiment, the conductive member 4 has the first conductive layer 6A and the second conductive layer 6B, and the third mesh pattern MP3 is formed by overlapping the first conductive layer 6A and the second conductive layer 6B each other. However, as long as a mesh pattern constituted by, as mesh cells, quadrangles, each of which has two acute angles of less than 90 degrees and two obtuse angles of more than 90 degrees and in which the angle of the two acute angles is 44 degrees or more and 54 degrees or less, in a case where the transparent insulating substrate 5 is viewed from the viewing side is formed, the conductive member 4 is not limited to having two conductive layers. For example, in a case where the first mesh pattern MP1 in the first conductive layer 6A is constituted by a quadrangular mesh cell which has two acute angles of less than 90 degrees and two obtuse angles of more than 90 degrees, and in which the degree of the two acute angles is 44 degrees or more and 54 degrees or less, the conductive member 4 may have only the first conductive layer 6A as a conductive layer. A touch panel constituted by only the first conductive layer 6A is disclosed in, for example, JP2015-106240A.

In the embodiment of the present invention, although the first conductive layer 6A is formed on the first surface 5A of the transparent insulating substrate 5, and the second conductive layer 6B is formed on the second surface 5B of the transparent insulating substrate 5, that is, the two conductive layers 6A and 6B are respectively arranged on both surfaces of the transparent insulating substrate 5 so as to face each other, as long as the first conductive layer 6A and the second conductive layer 6B are insulated from each other, the present invention is not limited to this embodiment.

Figure 9:
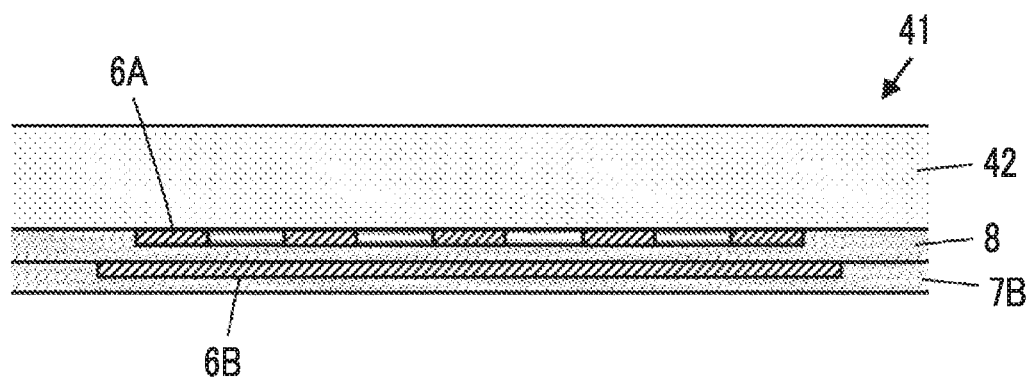
FIG. 9 is a partial cross-sectional view of a touch panel according to a modification example of the embodiment of the present invention.

FIG. 9 shows a partial cross-sectional view of a touch panel 41 according to a modification example of the embodiment of the present invention. In the example shown in FIG. 9, a first conductive layer 6A is formed on a transparent insulating substrate 42 formed of tempered glass, and an interlayer transparent insulating layer 8 is formed so as to cover the first conductive layer 6A. Further, a second conductive layer 6B is formed on the interlayer transparent insulating layer 8, and a protective layer 7B is formed so as to cover the second conductive layer 6B. That is, the two conductive layers 6A and 6B are arranged on one surface of the transparent insulating substrate 42 so as to overlap each other. In this case, the interlayer transparent insulating layer 8 covering the first conductive layer 6A is interposed between the first conductive layer 6A and the second conductive layer 6B, and the first conductive layer 6A and the second conductive layer 6B are insulated from each other by the presence of the interlayer transparent insulating layer 8. In addition, in the modification example shown in FIG. 9, the transparent insulating substrate 42 can be used as the cover panel 2 shown in FIG. 1. Although not shown, a transparent insulating layer may be provided between the transparent insulating substrate 42 and the first conductive layer 6A.

Figure 10:
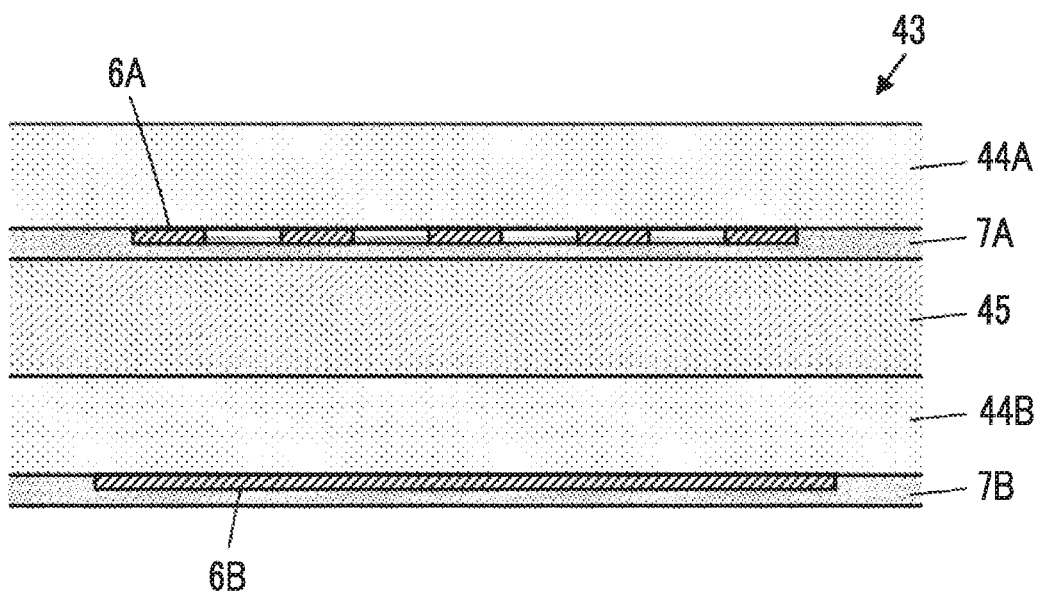
FIG. 10 is a partial cross-sectional view of a touch panel according to another modification example of the embodiment of the present invention.

FIG. 10 shows a partial cross-sectional view of a touch panel 43 according to another modification example of the embodiment of the present invention. In the modification example shown in FIG. 10, a first conductive layer 6A is formed on a first transparent insulating substrate 44A, and a protective layer 7A is formed so as to cover the first conductive layer 6A. In addition, a second conductive layer 6B is formed on a second transparent insulating substrate 44B, and a protective layer 7B is formed so as to cover the second conductive layer 6B. Further, the protective layer 7A formed on the first transparent insulating substrate 44A and the second transparent insulating substrate 44B are bonded to each other via a transparent adhesive layer 45. In this case, the protective layer 7A covering the first conductive layer 6A, the adhesive layer 45, and the second transparent insulating substrate 44B are interposed between the first conductive layer 6A and the second conductive layer 6B, and the first conductive layer 6A and the second conductive layer 6B are insulated from each other by the presence of the protective layer 7A, the adhesive layer 45, and the second transparent insulating substrate 44B. In addition, in the modification example shown in FIG. 10, the first transparent insulating substrate 44 can be used as the cover panel 2 shown in FIG. 1. The conductive member according to the embodiment of the present invention is not limited to the embodiments shown in FIGS. 9 and 10 and may have a structure in which the first conductive layer 6A and the second conductive layer 6B are insulated from each other.

In addition, the third mesh pattern MP3 is constituted by a mesh formed by a regular pattern, but is not limited thereto. The third mesh pattern may be constituted by a mesh formed by an irregular pattern. In this case, as the third mesh cell C3 constituting the third mesh pattern MP3, a quadrangular mesh cell having an irregular side length of −10% to +10% with respect to an average value of the lengths of the sides of the third mesh cell C3 can be used. As described above, by forming the third mesh cell C3 to have a random shape, in a case where the touch panel 1 or the conductive member 4 is arranged on the display panel 32, moire can be reduced and further color noise can be reduced.

Further, in this case, in a case of calculating the average value of the lengths of the sides of the plurality of third mesh cells C3, an average value of the lengths of the sides of the third mesh cells C3 arranged in a region having the predetermined area can be calculated. For example, it is possible to calculate the average of the lengths of the sides of a plurality of mesh cells arranged in a region of 10 mm×10 mm. In addition to the above, as examples of the irregular pattern, mesh patterns disclosed in JP2013-214545A and JP2015-143978A can be used.

Hereinafter, each member constituting the conductive member 4 of the embodiment will be described.

<Transparent Insulating Substrate>

The material of the transparent insulating substrate 5 is not particularly limited as long as the material is transparent, has electric insulation, and can support the first conductive layer 6A and the second conductive layer 6B. For example, as the material constituting the transparent insulating substrate 5, glass, tempered glass, non-alkali glass, polyethylene terephthalate (PET), polyethylene naphthalate (PEN), cyclo-olefin polymer (COP), cyclic olefin copolymer (COC), polycarbonate (PC), acrylic resin, polyethylene (PE), polypropylene (PP), polystyrene (PS), polyvinyl chloride (PVC), polyvinylidene chloride (PVDC), cellulose triacetate (TAC) and the like can be used. The thickness of the transparent insulating substrate 5 is, for example, 20 µm to 1000 µm, and particularly preferably 30 µm to 100 µm. The total light transmittance of the transparent insulating substrate 5 is preferably 40% to 100%. The total light transmittance is measured using, for example, "Plastics-A Method of Obtaining Total Light Transmittance and Total Light Reflectance" defined by JIS K 7375: 2008.

<Thin Metal Wire>

The thin metal wire MW1 forming the first detection electrode SE1 and the thin metal wire MW2 forming the second detection electrode SE2 are thin metal wires having a line width of 0.5 µm or more and 10 µm or less. A more preferable line width of these thin metal wires is 1 µm or more and 4 µm or less. Preferable materials of the thin metal wires include silver, copper, aluminum, gold, molybdenum, chromium, and the like, and alloys and oxides thereof or laminates thereof can be used. Particularly, from the viewpoint of the resistance value, silver or copper is preferable, and for example, a thin metal wire having a laminated configuration such as molybdenum/aluminum/molybdenum, molybdenum/copper/molybdenum, or copper oxide/copper/copper oxide can be used. The film thickness of the thin metal wires MW1 and MW2 is 0.05 µm or more and 10 µm or less, and preferably 0.1 µm or more and 1 µm or less. For the purpose of improving the visibility of the thin metal wire, a blackening layer may be provided on the thin metal wire or between the thin metal wire and the transparent insulating substrate 5 and the thin metal wire. For the blackening layer, copper oxide, molybdenum oxide, or the like can be used.

<Protective Layer>

As the transparent protective layers 7A and 7B respectively covering the thin metal wires MW1 and MW2, organic films of gelatin, acrylic resin, urethane resin and the like and inorganic films of silicon dioxide and the like can be used, and the film thickness is preferably 0.01 µm or more and 10 µm or less. As necessary, a transparent coat layer may be formed on the protective layer. As the transparent coat layer, an organic film of acrylic resin, urethane resin or the like is used, and the film thickness is preferably 1 µm or more and 100 µm or less.

In addition, as necessary, the following layers can be additionally provided to the conductive member 4 of the embodiment.

<Peripheral Wiring Insulating Film>

A peripheral wiring insulating film may be formed on the first peripheral wiring 12 and the second peripheral wiring 22 shown in FIG. 2 for the purpose of preventing a short circuit between the peripheral wirings and corrosion of the peripheral wirings. As the peripheral wiring insulating film, an organic film of acrylic resin, urethane resin or the like is used, and the film thickness is preferably 1 µm or more and 30 µm or less. The peripheral wiring insulating film may be formed on only one of the first peripheral wiring 12 and the second peripheral wiring 22.

<Undercoat Layer>

An undercoat layer may be provided between the transparent insulating substrate 5 and the first conductive layer 6A or between the transparent insulating substrate 5 and the second conductive layer 6B to enhance adhesiveness. As the undercoat layer, organic films of gelatin, acrylic resin, urethane resin, polyester resin and the like, and inorganic films of silicon dioxide and the like can be used, and the film thickness is preferably 0.01 μm or more and 10 μm or less.

<Flattening Layer>

A flattening layer may be provided between the transparent insulating substrate 5 and the first conductive layer 6A or between the transparent insulating substrate 5 and the second conductive layer 6B to flatten the surface of the transparent insulating substrate 5. As the flattening layer, organic films of acrylic resin, urethane resin, polyester resin and the like can be used, and the film thickness is preferably 0.01 μm or more and 10 μm or less. Particularly, in a case where a decorative layer (not shown) is provided on the transparent insulating substrate 5, it is preferable to provide the flattening layer.

<Circularly Polarizing Plate or Polarizing Plate>

In the configuration of the touch panel 1 shown in FIG. 1, a circularly polarizing plate or a polarizing plate may be provided between the cover panel 2 and the conductive member 4.

The conductive member 4 according to the embodiment of the present invention preferably has a shape of a conductive sheet. This sheet shape may be a film shape. Further, the conductive member 4 according to the embodiment of the present invention is preferably used for a touch sensor, and the touch sensor is preferably used for a touch panel.

EXAMPLES

Hereinafter, the present invention will be described in more detail based on the following examples. The materials, amounts used, ratios, treatment contents, treatment orders, and the like shown in the following examples can be appropriately changed without departing from the gist of the present invention, and the scope of the present invention should not be interpreted in a limited manner by the examples described below.

First, a method of producing the conductive member 4 according to the embodiment of the present invention will be described in detail.

(Preparation of Silver Halide Emulsion)

To the following liquid 1 kept at a temperature of 38° C. and a pH (potential of hydrogen) of 4.5, each of the following liquids 2 and 3 was simultaneously added in an amount corresponding to 90% with stirring over 20 minutes, thereby forming nucleus particles of 0.16 μm. Subsequently, the following liquids 4 and 5 were added over 8 minutes, and the remaining liquids 2 and 3 were added in an amount of 10% over 2 minutes, thereby growing the particles to 0.21 μm. Further, 0.15 g of potassium iodide was added, the mixture was ripened for 5 minutes, and then the particle formation was completed.

Liquid 1:

| Water | 750 ml |
|---|---|
| Gelatin | 9 g |
| Sodium chloride | 3 g |
| 1,3-dimethylimidazolidin-2-thione | 20 mg |
| Sodium benzenethiosulfonate | 10 mg |
| Citric acid | 0.7 g |

Liquid 2:

| Water | 300 ml |
|---|---|
| Silver nitrate | 150 g |

Liquid 3:

| Water | 300 ml |
|---|---|
| Sodium chloride | 38 g |
| Potassium bromide | 32 g |
| Potassium hexachloroiridate (III) (0.005% KCl 20% aqueous solution) | 8 ml |
| Ammonium hexachlororhodinate (0.001% NaCl 20% aqueous solution) | 10 ml |

Liquid 4:

| Water | 100 ml |
|---|---|
| Silver nitrate | 50 g |

Liquid 5:

| Water | 100 ml |
|---|---|
| Sodium chloride | 13 g |
| Potassium bromide | 11 g |
| Yellow prussiate of potash | 5 mg |

Thereafter, the resultant was washed with water by a flocculation method according to a usual manner. Specifically, the temperature was lowered to 35° C., 3 liters of distilled water was added, and the pH was lowered by using sulfuric acid until the silver halide was precipitated (in a range of pH 3.6±0.2). Next, about 3 liters of the supernatant was removed (first water washing). Further, 3 liters of distilled water was added and then sulfuric acid was added until the silver halide was precipitated, 3 liters of the supernatant was removed again (second washing). The same operation as the second washing was repeated once or more (third washing), thereby completing a water washing and desalting step. The emulsion after the water washing and desalting was adjusted to a pH of 6.4 and a pAg of 7.5, 3.9 g of gelatin, 10 mg of sodium benzenethiosulfonate, 3 mg of sodium benzenethiosulfinate, 15 mg of sodium thiosulfate, and 10 mg of chloroauric acid were added, chemical sensitization was performed so as to obtain optimum sensitivity at 55° C., and 100 mg of 1,3,3a,7-tetraazaindene as a stabilizer and 100 mg of PROXEL (trade name, manufactured by ICI Co., Ltd.) as a preservative were added. The finally obtained emulsion was a silver iodochlorobromide cubic grain emulsion containing 0.08% by mole of silver iodide, having a proportion of silver chlorobromide of 70% by mole of silver chloride and 30% by mole of silver bromide, and having an average grain size of 0.22 μm and a coefficient of variation of 9%.

(Preparation of Composition for Forming Photosensitive Layer)

To the emulsion, $1.2 \times 10^{-4}$ moles/mole Ag of 1,3,3a,7-tetraazaindene, $1.2 \times 10^{-2}$ moles/mole Ag of hydroquinone, $3.0 \times 10^{-4}$ moles/mole Ag of citric acid, 0.90 g/mole Ag of 2,4-dichloro-6-hydroxy-1,3,5-triazine sodium salt, and a trace amount of a hardening agent were added, and the resulting coating liquid was adjusted to have a pH of 5.6 by using citric acid.

To the coating liquid, a polymer latex containing a polymer represented by (P-1) and a dispersant including dialkylphenyl PEO sulfuric acid ester (the mass ratio of dispersant/polymer was 2.0/100=0.02) was added such that a mass ratio of the polymer to the gelatin contained in the coating liquid was 0.5/1.

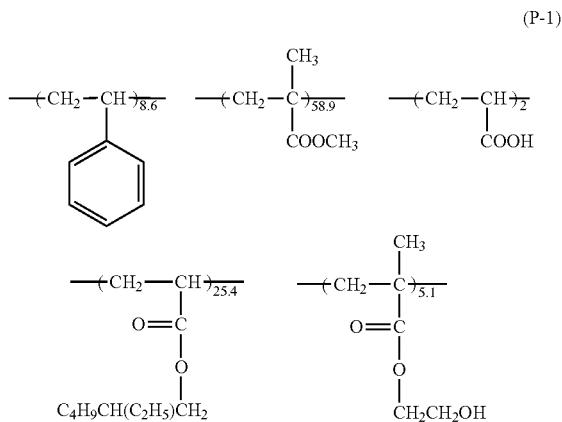

(P-1)

Further, as a crosslinking agent, EPOXY RESIN DY 022 (trade name: manufactured by Nagase ChemteX Corporation) was added thereto. The amount of the crosslinking agent added was adjusted such that the amount of the crosslinking agent in the photosensitive layer, which will be described later, became 0.09 g/m$^2$.

In this manner, a composition for forming a photosensitive layer was prepared.

The polymer represented by (P-1) above was synthesized with reference to JP3305459B and JP3754745B.

(Photosensitive Layer Forming Step)

The polymer latex described above was applied to both surfaces of the transparent insulating substrate to provide an undercoat layer having a thickness of 0.05 μm. As the transparent insulating substrate, a 38 μm polyethylene terephthalate film (manufactured by Fujifilm Corporation) was used.

Next, on the undercoat layer, an antihalation layer formed of a mixture of the polymer latex, gelatin, and a dye decolored by alkali of a developer with an optical density of about 1.0 was provided. The mixing mass ratio of the polymer and gelatin (polymer/gelatin) was 2/1, and the content of the polymer was 0.65 g/m$^2$.

The composition for forming a photosensitive layer was applied onto the antihalation layer, and a composition obtained by mixing the polymer latex, gelatin, EPOCROSS K-2020E (trade name: manufactured by Nippon Shokubai Co., Ltd., oxazoline-based crosslinking reactive polymer latex (crosslinkable group: oxazoline group)), and SNOWTEX C (registered trademark, trade name: colloidal silica, manufactured by Nissan Chemical Industries. Ltd.) at a solid content mass ratio (polymer/gelatin/EPOCROSS K-2020E/SNOWTEX C (registered trademark)) of 1/1/0.3/2 was applied such that the amount of gelatin became 0.08 g/m$^2$, thereby obtaining a support having photosensitive layers formed on both surfaces. The support having photosensitive layers formed on both surfaces is referred to as a film A. The formed photosensitive layer had a silver amount of 6.2 g/m$^2$ and a gelatin amount of 1.0 g/m$^2$.

(Exposure and Development Step)

For example, a first photo mask for forming a first detection electrode having a pattern as shown in FIG. 3 and a second photo mask for forming a second detection electrode having a pattern as shown in FIG. 4 were respectively prepared, and then the first photo mask and the second photo mask were respectively arranged on both surfaces of the film A to simultaneously expose the both surfaces to parallel light using a high pressure mercury lamp as a light source.

After the exposure, the film was developed with the following developer, and further subjected to a development treatment using a fixing solution (trade name: N3X-R for CN16X, manufactured by Fujifilm Corporation). Further, the support was rinsed with pure water and dried, thereby obtaining a support having a thin metal wire formed of Ag (silver) and a gelatin layer formed on both surfaces. The gelatin layer was formed between the thin metal wires. The obtained film is referred to as a film B.

(Composition of Developer)

The following compounds were contained in 1 liter (L) of the developer.

| | |
|---|---|
| Hydroquinone | 0.037 mol/L |
| N-methylaminophenol | 0.016 mol/L |
| Sodium metaborate | 0.140 mol/L |
| Sodium hydroxide | 0.360 mol/L |
| Sodium bromide | 0.031 mol/L |
| Potassium metabisulfite | 0.187 mol/L |

(Gelatin Decomposition Treatment)

The film B was immersed in an aqueous solution (concentration of protease: 0.5% by mass, liquid temperature: 40° C.) of a proteinase (BIOSEPLASE AL-15FG, manufactured by Nagase ChemteX Corporation) for 120 seconds. The film B was taken out of the aqueous solution and washed by being immersed in hot water (liquid temperature: 50° C.) for 120 seconds. The film after the gelatin decomposition treatment is referred to as a film C.

<Resistance Lowering Treatment>

The film C was subjected to a calendering treatment at a pressure of 30 kN using a calendering device including metal rollers. At this time, two polyethylene terephthalate films having a rough surface shape with a line roughness Ra=0.2 μm and Sm=1.9 μm (measured with a shape analysis laser microscope VK-X110, manufactured by KEYENCE CORPORATION (JIS-B-0601-1994)) were handled together such that the rough surfaces thereof faced the front and back surfaces of the film C, and the rough surface shapes were transferred and formed on the front and back surfaces of the film C.

After the above calendering treatment, a heating treatment was performed by allowing the film to pass through a superheated vapor tank at a temperature of 150° C. for 120 seconds. The film after the heat treatment is referred to as a film D. This film D is a conductive member.

<Production of Touch Panel>

By the above method, a conductive member including the first detection electrode having the same shape as the first detection electrode SE1 in the embodiment shown in FIG. 3 and the second detection electrode having the same shape as the second detection electrode SE2 in the embodiment shown in FIG. 4 was produced. In this case, the first detection electrode and the second detection electrode had a rhombic mesh shape formed by the thin metal wires, and the line width of the thin metal wire was 4.0 μm. A dummy electrode having the same rhombic mesh shape as the detection electrode formed by a thin metal wire having a line width of 4.0 μm was arranged between the first detection electrodes and between the second detection electrodes. In addition, for the evaluation, a plurality of conductive members were produced by changing the degree of the acute angles of the rhombic mesh cell and the length of one side of the rhombic mesh cell in the mesh pattern formed by combining the first detection electrode and the second detection electrode with each other.

Further, a plurality of touch panels were produced by bonding each of the plurality of conductive members produced to a cover panel formed of tempered glass having a thickness of 1.1 mm using an optically transparent pressure adhesive sheet having a thickness of 75 μm and formed of #8146-4 (product number), manufactured by 3M Corporation.

Next, Examples 1 to 6 and Comparative Examples 1 to 5 will be described. Examples 1 to 6 and Comparative Examples 1 to 5 are touch panels having the same configuration as the touch panel 1 according to the embodiment of the present invention shown in FIGS. 1 to 5, and the degrees of the acute angles A3 of the rhombic third mesh cells C3 of each touch panel are different from each other. Examples 1 to 6 and Comparative Examples 1 to 5 included a plurality of samples prepared by changing the length of one side of the third mesh cell C3, respectively and the length of one side of the third mesh cell C3 of each sample was 160 μm, 168 μm, 176 μm, 184 μm, 192 μm, 200 μm, 208 μm, 216 μm, 220 μm, 228 μm, 232 μm, 240 μm, 248 μm and 252 μm.

Example 1

Example 1 was a touch panel having the same configuration as the touch panel 1 according to the embodiment of the present invention shown in FIGS. 1 to 5, and the degree of the acute angles A3 of the rhombic third mesh cell C3 was set to 44 degrees.

Example 2

Example 2 was the same as Example 1 except that the degree of the acute angles A3 of the rhombic third mesh cell C3 was set to 46 degrees.

Example 3

Example 3 was the same as Example 1 except that the degree of acute angles A3 of the rhombic third mesh cell C3 was set to 48 degrees.

Example 4

Example 4 was the same as Example 1 except that the degree of the acute angles A3 of the rhombic third mesh cell C3 was set to 50 degrees.

Example 5

Example 5 was the same as Example 1 except that the degree of the acute angles A3 of the rhombic third mesh cell C3 was set to 52 degrees.

Example 6

Example 6 was the same as Example 1 except that the degree of the acute angles A3 of the rhombic third mesh cell C3 was set to 54 degrees.

Comparative Example 1

Comparative Example 1 was the same as Example 1 except that the degree of the acute angles A3 of the rhombic third mesh cell C3 was set to 40 degrees.

Comparative Example 2

Comparative Example 2 was the same as Example 1 except that the degree of the acute angles A3 of the rhombic third mesh cell C3 was set to 42 degrees.

Comparative Example 3

Comparative Example 3 was the same as Example 1 except that the degree of the acute angles A3 of the rhombic third mesh cell C3 was set to 56 degrees.

Comparative Example 4

Comparative Example 4 was the same as Example 1 except that the degree of the acute angles A3 of the rhombic third mesh cell C3 was set to 58 degrees.

Comparative Example 5

Comparative Example 5 was the same as Example 1 except that the degree of the acute angles A3 of the rhombic third mesh cell C3 was set to 60 degrees.

<Moire Evaluation>

The touch panels of Examples 1 to 6 and Comparative Examples 1 to 5 were arranged on an organic EL display panel in which a plurality of pixels were arranged in a mosaic array or a delta array shown in FIGS. 7 and 8, and 10 observers observed the touch panels with the naked eyes at a position 5 cm away from the surface of the touch panel and evaluated whether or not moire was visually recognized. The touch panel was arranged on an organic EL display panel such that the direction of the acute angles A3 of the third mesh cell C3 (the direction along the bisector of the acute angles A3; the second direction D2 in FIG. 5) matched with the direction in which the plurality of sub-pixels were arrayed in the organic EL display panel so as to repeat the order of the red pixel R, the green pixel G, and the blue pixel B (the second direction D2 in FIG. 7), and the moire was evaluated.

In the organic EL display panel used in this case, the horizontal width LR1 of the red pixel R, the horizontal width LG1 of the green pixel G, the horizontal width LB1 of the blue pixel B, and the vertical width LB2 of the blue pixel B were all 18 μm, and the vertical width LR2 of the red pixel R and the vertical width LG2 of the green pixel G were both 8 μm. The first direction pixel pitch P1 of the pixels PE1 and PE2 including the red pixel R, the green pixel G, and the blue pixel B was 96 μm, and the second direction pixel pitch P2 was 62 μm.

For moire evaluation, the evaluation standards of A to E were set as follows, and the evaluation result with the largest number among the evaluation results by 10 observers was defined as the final evaluation result. Here, in the following evaluation standards, the intensity of moire indicates the degree to which moire is remarkably visually recognized. For example, in a case where the intensity of moire is low, this case indicates that the moire itself is visually recognized but is not clearly visually recognized, and in a case where the intensity of moire is high, the moire is clearly visually recognized.

A: The moire was not visually recognized in all of the red pixel R, the green pixel G, and the blue pixel B, and the level was very excellent.
B: The moire was not visually recognized in any one of the red pixel R and the blue pixel B, and the green pixel G, and the level was excellent.
C: The moire was not visually recognized in the green pixel G, and there was no problem in use.
D: Although the moire was visually recognized in the green pixel G, the intensity of moire was low, and there was no problem in use. E: The moire was visually recognized in the green pixel G, the intensity of moire was high, and there was a problem in use.

The results of the moire evaluation for Examples 1 to 6 and Comparative Examples 1 to 5 are shown in the following tables.

TABLE 11

| | Angle | Length of one side (μm) | | | | | | | | | | | | |
|---|---|---|---|---|---|---|---|---|---|---|---|---|---|---|
| | (°) | 160 | 168 | 176 | 184 | 192 | 200 | 208 | 216 | 220 | 228 | 232 | 240 | 248 | 252 |
| Comparative Example 1 | 40 | E | E | E | E | E | E | E | E | E | E | E | E | E | E |
| Comparative Example 2 | 42 | E | E | E | E | E | E | E | E | E | E | E | E | E | E |
| Example 1 | 44 | D | B | B | B | B | C | C | C | C | C | C | C | C | D |
| Example 2 | 46 | C | A | A | A | A | B | B | B | B | B | B | B | B | C |
| Example 3 | 48 | C | A | A | A | A | B | B | B | B | B | B | B | B | C |
| Example 4 | 50 | C | A | A | A | A | B | B | B | B | B | B | B | B | C |
| Example 5 | 52 | D | B | B | B | B | C | C | C | C | C | C | C | C | D |
| Example 6 | 54 | D | B | B | B | B | C | C | C | C | C | C | C | C | D |
| Comparative Example 3 | 56 | E | E | E | E | E | E | E | E | E | E | E | E | E | E |
| Comparative Example 4 | 58 | E | E | E | E | E | E | E | E | E | E | E | E | E | E |
| Comparative Example 5 | 60 | E | E | E | E | E | E | E | E | E | E | E | E | E | E |

As shown in Table 1, in Examples 1 to 6, the moire evaluation was all "D" or higher, and the moire could be reduced. Particularly, in Examples 2 to 4, the moire evaluation was all "C" or higher. On the other hand, in Comparative Examples 1 to 5, the moire evaluation was all "E".

In Examples 1 to 6 in which the moire evaluation is "D" or higher, the degree of the acute angles A3 of the third mesh cell C3 is set within a range of 44 degrees to 54 degrees. Therefore, it is found that the moire is reduced by setting the degree of the acute angles A3 of the third mesh cell C3 to an angle in this range. Further, it is found that in a case where the length of one side of the third mesh cell C3 is set within a range of 168 μm or more and 248 μm or less, the moire evaluation is "C" or higher. Particularly, by setting the length of one side of the third mesh cell C3 to 168 μm or more and 192 μm or less, in all of the moire evaluations, a standard "B" or higher can be obtained, and an excellent touch panel can be obtained.

Among Examples 1 to 6, particularly, in Examples 2 to 4 in which the moire evaluation is "C" or higher, the degree of the acute angles A3 of the third mesh cell C3 is set to 46 degrees or more and 50 degrees or less. Therefore, it is found that the moire is reduced by setting the degree of the acute angles A3 of the third mesh cell C3 to an angle in this range. Further, it is found that in a case where the length of one side of the third mesh cell C3 is set within a range of 168 μm or more and 248 μm or less, the moire evaluation is "B" or higher. Particularly, by setting the length of one side of the third mesh cell C3 to 168 μm or more and 192 μm or less, in all of the moire evaluations, a standard "A" or higher can be obtained, and a very excellent touch panel can be obtained.

In Comparative Examples 1 to 5 in which the moire evaluation is "E", the degree of the acute angles A3 of the third mesh cell C3 is outside a range of 44 degrees or more and 54 degrees or less. Therefore, it is found that in a case where the degree of the acute angles A3 of the third mesh cell C3 is set to an angle outside this range, the moire is remarkably visually recognized and a touch panel having a problem in use is obtained.

EXPLANATION OF REFERENCES 1, 41, 43: touch panel
1A: front surface
1B: back side
2: cover panel
3, 45: adhesive layer
4: conductive member
5, 42: transparent insulating substrate
6A: first conductive layer
6B: second conductive layer
7A, 7B: protective layer
8: interlayer transparent insulating layer
12: first peripheral wiring
13: first external connection terminal
14: first electrode pad
22: second peripheral wiring
23: second external connection terminal
24: second electrode pad
31: display device
32: display panel
44A: first transparent insulating substrate
44B: second transparent insulating substrate
A1, A2, A3: acute angle
B: blue pixel
B1, B2, B3: obtuse angle
C1: first mesh cell
C2: second mesh cell
C3: third mesh cell
D1: first direction
D2: second direction
E: array axis
G: green pixel
L1: array interval LB1, LG1, LR1: horizontal width
LB2, LG2, LR2: vertical width
MP1: first mesh pattern
MP2: second mesh pattern
MP3: third mesh pattern
MW1, MW2: thin metal wire
P1: first direction pixel pitch
P2: second direction pixel pitch
PE1, PE2: pixel
R: red pixel
R0: region
S1: input region
S2: outer region
SE1: first detection electrode
SE2: second detection electrode

What is claimed is:

1. A conductive member comprising:
a transparent insulating substrate; and
at least one conductive layer which has a plurality of thin metal wires and is arranged on the transparent insulating substrate,
wherein in a case of being viewed from a direction perpendicular to the transparent insulating substrate, a mesh pattern is formed by the plurality of thin metal wires,
the mesh pattern is constituted by a plurality of quadrangular mesh cells having two acute angles of less than 90 degrees and two obtuse angles of more than 90 degrees, and
a degree of the acute angles is 46 degrees or more and 50 degrees or less.

2. The conductive member according to claim 1, wherein the quadrangular mesh cell has a shape of rhombus.

3. The conductive member according to claim 2, wherein a length of one side of the rhombus is 168 μm or more and 248 μm or less.

4. The conductive member according to claim 3, wherein the length of one side of the rhombus is 168 μm or more and 192 μm or less.

5. The conductive member according to claim 4, wherein a line width of the thin metal wire is 1 μm or more and 4 μm or less.

6. The conductive member according to claim 1, wherein two layers of the conductive layers are arranged on the transparent insulating substrate, and
the plurality of thin metal wires of the two conductive layers are combined with each other to form the mesh pattern.

7. The conductive member according to claim 6, wherein the two conductive layers are respectively arranged on both surfaces of the transparent insulating substrate.

8. The conductive member according to claim 6, wherein the two conductive layers are arranged on one surface of the transparent insulating substrate so as to overlap each other.

9. A touch panel using the conductive member according to claim 1.

10. A display device comprising:
a display panel in which a plurality of pixels are arrayed in a mosaic array or a delta array; and
a conductive member including a transparent insulating substrate, and at least one conductive layer which has a plurality of thin metal wires and is arranged on the transparent insulating substrate,
wherein in a case of being viewed from a direction perpendicular to the transparent insulating substrate, a mesh pattern is formed by the plurality of thin metal wires,
the mesh pattern is constituted by a plurality of quadrangular mesh cells having two acute angles of less than 90 degrees and two obtuse angles of more than 90 degrees, and
a degree of the acute angles is 44 degrees or more and 54 degrees or less.

11. The display device according to claim 10,
wherein the plurality of pixels have an array direction in which a plurality of sub-pixels are arrayed so as to repeat an order of a red pixel R, a green pixel G, and a blue pixel B,
the quadrangular mesh cells are rhombic mesh cells, and
the array direction and a direction along a bisector of the acute angles of the rhombic mesh cells match with each other.

12. The display device according to claim 11,
wherein the degree of the acute angles is 46 degrees or more and 50 degrees or less.

13. The display device according to claim 12,
wherein a length of one side of the rhombus is 168 μm or more and 248 μm or less.

14. The display device according to claim 13,
wherein the length of one side of the rhombus is 168 μm or more and 192 μm or less.

15. The display device according to claim 14,
wherein a line width of the thin metal wire is 1 μm or more and 4 μm or less.

16. The display device according to claim 11,
wherein two layers of the conductive layers are arranged on the transparent insulating substrate, and
the plurality of thin metal wires of the two conductive layers are combined with each other to form the mesh pattern.

17. The display device according to claim 10,
wherein the conductive member constitutes a touch panel.

18. The display device according to claim 10,
wherein the plurality of pixels are constituted by organic EL elements.

19. The display device according to claim 18,
wherein a pixel pitch of the plurality of pixels is 40 μm or more and 110 μm or less.

* * * * *